United States Patent [19]

Capasso et al.

[11] Patent Number: 5,311,009
[45] Date of Patent: May 10, 1994

[54] QUANTUM WELL DEVICE FOR PRODUCING LOCALIZED ELECTRON STATES FOR DETECTORS AND MODULATORS

[75] Inventors: Federico Capasso, Westfield; Alfred Y. Cho, Summit; Jerome Faist, Scotch Plains; Carlo Sirtori, Summit; Deborah L. Sivco, Warren, all of N.J.

[73] Assignee: AT&T Bell Laboratories, Murray Hill, N.J.

[21] Appl. No.: 923,197

[22] Filed: Jul. 31, 1992

[51] Int. Cl.$^5$ ............................................. H01L 27/12
[52] U.S. Cl. ................................. 250/214 LS; 257/17; 257/21
[58] Field of Search ............... 250/214.1, 338.4, 339, 250/370.01, 370.08, 370.12, 214.65; 257/14, 15, 17, 21, 184

[56] References Cited

U.S. PATENT DOCUMENTS

| | | | |
|---|---|---|---|
| 4,894,526 | 1/1990 | Bethea et al. | 250/214.1 |
| 5,023,685 | 6/1991 | Bethea et al. | 357/30 |
| 5,036,371 | 7/1991 | Schwartz | 257/14 |
| 5,068,867 | 11/1991 | Hasenberg et al. | 257/17 X |
| 5,091,756 | 2/1992 | Iga et al. | 357/4 |
| 5,105,301 | 4/1992 | Campi | 257/17 X |
| 5,126,553 | 6/1992 | England et al. | 257/14 X |
| 5,142,341 | 8/1992 | Goronkin et al. | 257/187 X |
| 5,185,647 | 2/1993 | Vasquez | 257/17 |
| 5,187,553 | 2/1993 | Makita | 257/187 |

OTHER PUBLICATIONS

K. Kishino, et al. "Enhanced carrier confinement effect by the multiquantum barrier in 660 nm GaInP/AlInP visible Lasers", *Appl. Phys. Lett.*, vol. 58, pp. 1822-1824 (1991). Jan. 31, 1991.
T. Takagi, et al. "Electron-wave reflection by multi--quantum barrier in n-GaAs/i-AlGaAs/n-GaAs tunneling diode", *Appl. Phys. Lett.*, vol. 59, pp. 2877-2879 (1991). Sep. 4, 1991.
T. Takagi, et al. "Design and Photoluminescence Study on a Multiquantum Barrier", *IEEE J. of Quantum Electronics*, vol. 27, No. 6, pp. 1511-1519 (1991) Jun. 6, 1991.
G. Lenzi, et al. "Bragg confinement of carriers in a quantum barrier", *Appl. Phys. Lett.*, vol. 56, pp. 871-873 (1990). Feb. 26, 1990.
J. Salzman, et al. "Bragg confinement of carriers in a shallow quantum well", *Appl,. Phys. Lett.*, vol. 59, pp. 1858-1860 (1991). Jul. 15, 1991.
K. Iga, et al., "Electron Reflectance of Multiquantum Barrier (MQB)", *Electronics Letters*, vol. 22, No. 19, pp. 1008-1010 (1986). Sep. 11, 1986.
R. Dingle, et al. "Quantum States of Confined Carriers in Very Thin $Al_xGa_{1-x}As$-GaAs-$Al_xGa_{1-x}As$ Heterostructures", *Physical Review Letters*, vol. 33, No. 14, pp. 827-830 (1974) Sep. 30, 1974.
L. Esaki, et al. "New Transport Phenomenon in a Semiconductor 'Superlattice'", *Physical Review Letters*, vol. 33, No. 8, pp. 495-498 (1974) Aug. 19, 1974.

(List continued on next page.)

*Primary Examiner*—David C. Nelms
*Assistant Examiner*—John R. Lee
*Attorney, Agent, or Firm*—Glen E. Books

[57] ABSTRACT

In accordance with the invention, a quantum well device provides localized states for electrons having an energy E greater than the barrier height of the constituent quantum wells. The device comprises a confinement quantum well of width $L_w$ equal to an integer number n of deBroglie half wavelengths $$L_w = n\frac{\lambda}{2}$$

and a plurality of adjacent quarter wavelength barriers and wells, each having a thickness equal to an odd number m of deBroglie quarter wavelengths. Constructive interference between the waves partially reflected by the interfaces between adjacent $\lambda/4$ barriers and $\lambda/4$ wells leads to the formation of a localized electron state at an energy E in the region of the confinement well. The device can be used in detectors and modulators employing transitions between a bound state within the well and the localized state above the well.

8 Claims, 4 Drawing Sheets

OTHER PUBLICATIONS

F. H. Stillinger, et al. "Bound states in the continuum", *Physical Review A*, vol. 11, No. 2, pp. 446–454 (1975). Feb. 1975.

D. R. Herrick, "Construction of Bound States in the Continuum for Epitaxial Heterostructure Superlattices", *Physica*, vol. 85B, pp. 44–50 (1977).

F. H. Stillinger, "Potentials Supporting Positive-Energy Eigenstates and Their Application to Semiconductor Heterostructures", *Physica*, vol. 85B, pp. 170–276 (1977).

T. Takagi, et al. "Potential Barrier Height Analysis of AlGaInP Multi-Quantum Barrier (MQB)", *Japanese Journal of Applied Physics*, vol. 29, No. 11, pp. L1977–L1980 (1990) Nov. 11, 1990.

J. Weidmann, "Zur Spektraltheorie von Sturm-Liouville-Operatoren" *Math, Zeitschr*, vol. 98, pp. 268–302 (1967).

F. H. Stillinger, et al. "Role of electron correlation in determining the binding limit for two-electron atoms", *Physical Review A*, vol. 10, No. 4, pp. 1122–1130 (1974). Oct. 1974.

B. Simon, "On Positive Eigenvalues of One-Body Schrodinger Operators", *Comm. on Pure and Applied Math.*, vol. XXII, pp. 531–538 (1967).

QUANTUM WELL DEVICE FOR PRODUCING LOCALIZED ELECTRON STATES FOR DETECTORS AND MODULATORS

FIELD OF THE INVENTION

This invention relates to quantum well devices and, in particular, to a quantum well device capable of producing localized states for electrons having energy greater than the barrier height. The device is particularly useful in detectors and modulators.

BACKGROUND OF THE INVENTION

It is known that quantum well devices can bind electrons having energy less than the barrier heights of the constituent wells. Indeed such devices have been employed as infrared photodetectors. For example U.S. Pat. No. 4,894,526 issued Jan. 16, 1990, to Bethea et al., discloses a detector wherein infrared radiation incident on a superlattice of doped quantum wells gives rise to intersubband resonance radiation which excites electrons from the ground state in a well into an excited state. A photocurrent results from excited electrons tunneling out of the quantum wells. U.S. Pat. No. 5,023,685, issued Jun. 11, 1991, to Bethea et al., also shows a quantum well radiation detector. The wells have but a single-bound energy state.

The present applicant has discovered that, in addition to having electron bound states within a quantum well at energies below the barrier height, devices can be fabricated which have localized electron states at energies above the barrier height. This discovery permits the fabrication of a variety of new detectors and modulators.

SUMMARY OF THE INVENTION

In accordance with the invention, a quantum well device provides localized states for electrons having an energy E greater than the barrier height of the constituent quantum wells. The device comprises a confinement quantum well of width $L_w$ equal to an integer number n of deBroglie half wavelengths $$L_w = n\frac{\lambda}{2}$$

and a plurality of adjacent quarter wavelength barriers and wells, each having a thickness equal to an odd number m of deBroglie quarter wavelengths. Constructive interference between the waves partially reflected by the interfaces between adjacent λ/4 barriers and λ/4 wells leads to the formation of a localized electron state at an energy E in the region of the confinement well. The device can be used in detectors and modulators employing transitions between a bound state within the well and the localized state above the well.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical data, are not to scale.

DETAILED DESCRIPTION

Figure 1:
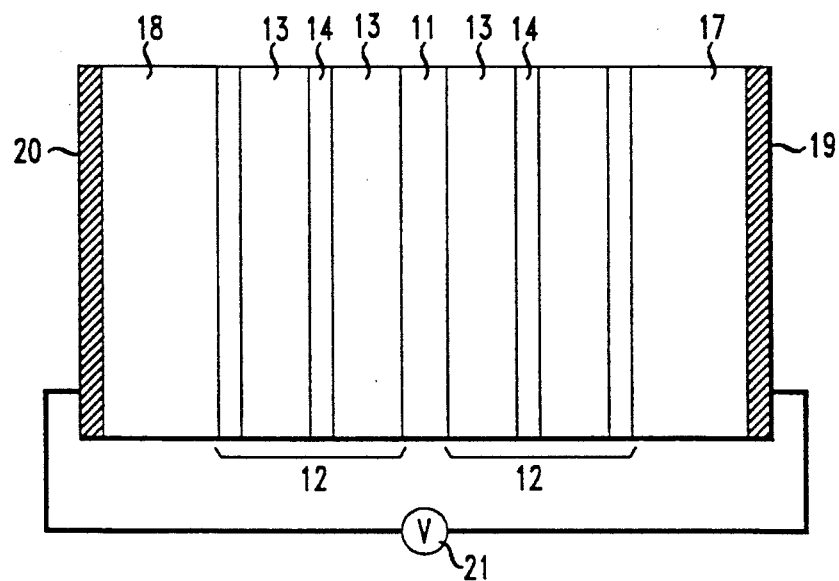
FIG. 1 is a schematic cross section of a quantum well device with a localized state at energy above the well.

Referring to the drawings, FIG. 1 is a schematic cross section of a quantum well device which can effectively localize electrons of energy E greater than the barrier height of the quantum well. In essence, the device 10 comprises a sequence of epitaxial heterolayers—barrier layers and well layers—forming confinement quantum well 11 of thickness $$n\frac{\lambda}{2},$$

where λ is the deBroglie wavelength for an electron of energy E and n is an integer. Adjacent well 11, on one or both sides, are quarter wave stacks 12 of barriers 13 and wells 14 each having thicknesses of $$m\frac{\lambda}{4}$$

where m is an odd integer. The electron energy E can be higher than the barrier height of the confinement well 11. The device can comprise a single repetition of a confinement well and quarter wave stacks or it can comprise many repetitions of the confinement well-quarter wave stack structure. Advantageously, contact layers 17 and 18 are provided for permitting ohmic contacts 19 and 20, and a voltage source 21 permits the application of a voltage V across the device.

It should be understood that the thickness of the λ/4 barriers 13 will be different than the thickness of the λ/4 wells 14. This difference is because an electron of energy E measured from the bottom of the well has a different deBroglie wavelength in the barrier layer than it has in the well layer. If E is the electron energy measured from the bottom of a well and $\Delta E_c$ is the barrier height, then $E_b = E - \Delta E_c$ is the energy for calculating the wavelength in a barrier region. Specifically, the deBroglie wavelength is $\lambda = 2\pi/K$ where K is the wave number. In a well region the wave number is $$K_w = \frac{\sqrt{2m_w^* E}}{\hbar^2}$$

where $m_w^*$ is the effective electron mass in the well. In a barrier region the wave number is $$K_b = \frac{\sqrt{2m_b^* E_b}}{\hbar^2},$$

where $m_b^*$ is the effective electron mass. The thickness of the confinement well $L_w$ satisfies the condition $K_w L_w = n\pi$, where n is an integer. The $\lambda/4$ wells satisfy $$K_w L_s = m\frac{\pi}{2},$$

where m is odd and the $\lambda/4$ barriers satisfy $$K_b L_b = m\frac{\pi}{2}.$$

Figure 2:
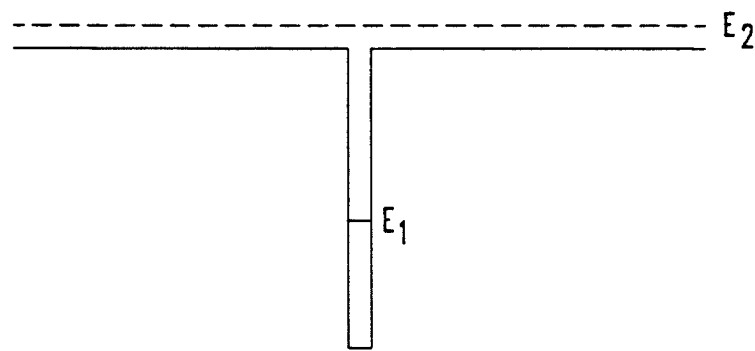
FIG. 2, which is conceptual, shows energy levels for an idealized rectangular model quantum well.

In operation, the device exhibits electron localization at the confinement well for electrons of energy E, localizing such electrons in the well even though E is above the barrier height. This operation can be understood by reference to FIGS. 2 and 3. FIG. 2 schematically shows the energy levels for a conventional rectangular quantum well. As shown, there can be bound states of electrons having kinetic energy $E_1$ less than the barrier height. However for electrons of energy $E_2$ greater than the barrier height there is a continuum of scattering states producing extended electron wave functions with non-vanishing amplitudes at infinity. There are transmission resonances (not shown) for discrete energies corresponding to a semi-integer number of electron wavelengths across the well. At these discrete energies the electron wave amplitude is enhanced, but the corresponding states remain extended. The wave functions do not decay exponentially in the barriers, but rather extend in a manner similar to plane waves. The electrons are not bound.

Figure 3:
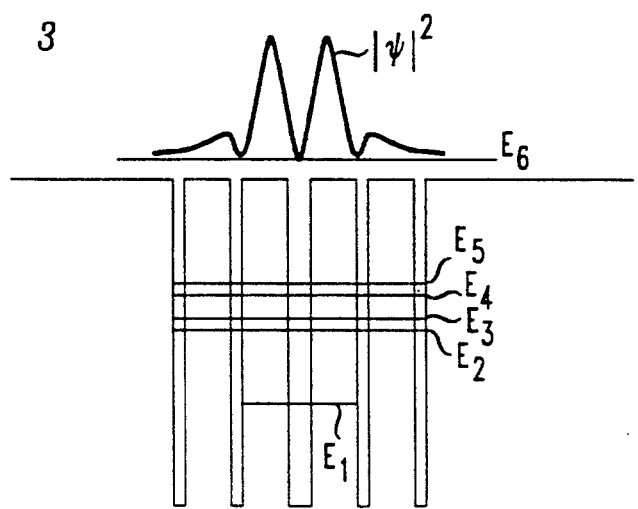
FIG. 3, which is also conceptual, shows energy levels and a wave function for an idealized device according to FIG. 1.

FIG. 3 schematically illustrates the energy levels and an associated electron wave function for the device of FIG. 1. The individual quantum wells can have bound states $E_1$ through $E_5$, but in addition, the structure of FIG. 1 can sharply localize the resonance states. The waves reflected from interfaces in the stacks 12 constructively interfere leading to a localized concentration of probability density $|\Psi|^2$ in the region of the confinement well 11. Thus a localized electron state at energy $E_6$ is produced in the region of well 11. In the limit of a superlattice of $\lambda/4$ stacks, the stacks become ideal Bragg reflectors, and the localized state approaches a true bound state. Experiments show that the presence of one or more quarter wave pairs considerably enhances the degree of localization.

The fabrication and structure of the invention can be understood in greater detail by consideration of the following specific examples. The exemplary structures can be conveniently fabricated by using molecular beam epitaxy (MBE) to grow the layers for the confinement well 11, $\lambda/4$ barriers 13 and $\lambda/4$ wells 14.

Four types of structures were fabricated: a reference sample consisting of quantum wells bound by conventional thick barriers and device samples with similar quantum wells clad by quarter-wave stacks consisting of 1, 2 and 6 periods (barrier-well pairs). The reference sample was grown by MBE lattice matched to insulating (100) InP substrates. The reference had twenty 32 Å InGaAs quantum wells n-doped to $1 \times 10^{18}$ cm$^{-3}$, all separated by 150 Å AlInAs barriers. The device samples had 32 Å InGaAs quantum wells n-doped to the same level, and the quarter wave stacks comprised 1, 2 and 6 periods, respectively, each period comprising an undoped 39 Å AlInAs barrier and an undoped 16 Å GaInAs well. A plurality of such devices separated by undoped 150 Å AlInAs layers were grown on each substrate. On each substrate the growth started and terminated with n-type GaInAs contact layers.

Figure 4:
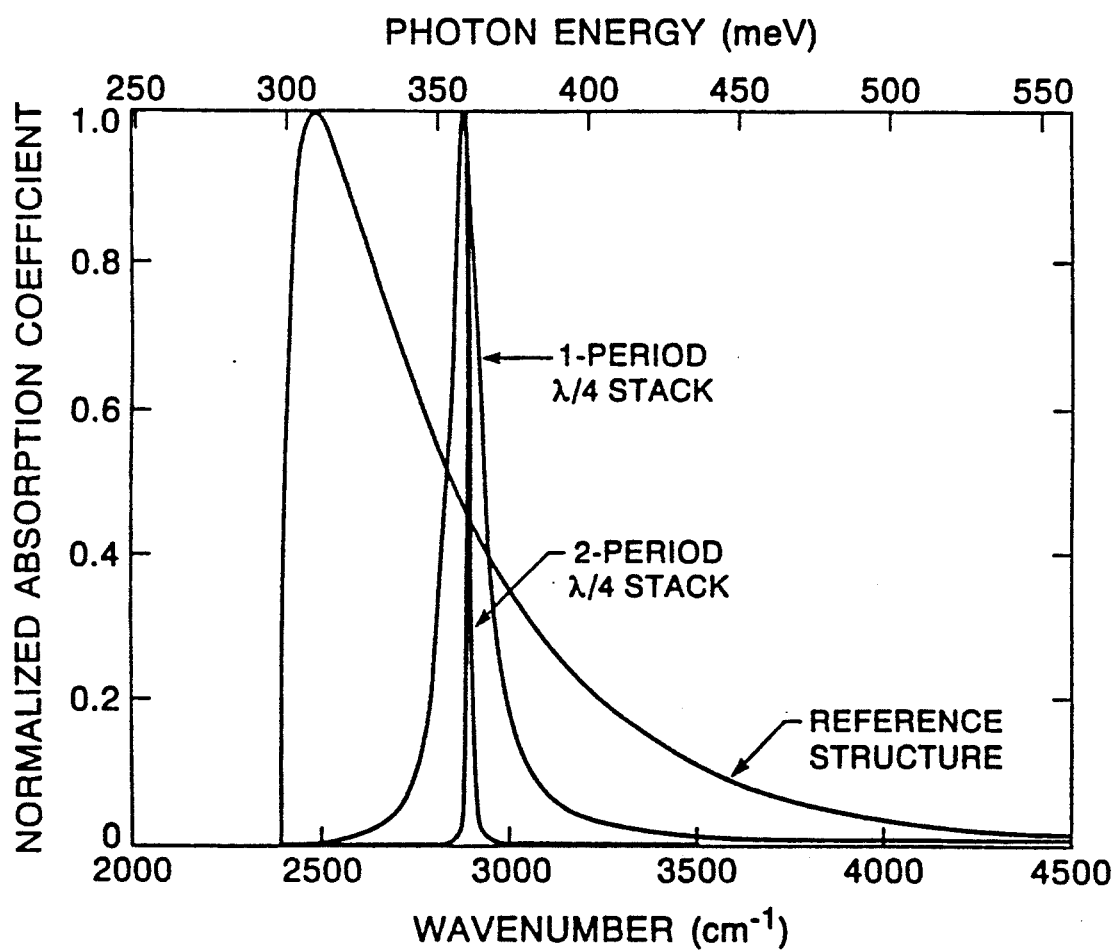
FIG. 4 is a graphical illustration showing predicted absorption spectra for a constructed reference structure and constructed devices of the type shown in FIG. 1.

Theoretical absorption spectra were calculated for the reference sample and for the devices with 1 and 2 period quarter wave stacks. FIG. 4 is a plot of the predicted absorption coefficients as functions of wave number. As can be seen, substantial narrowing of the absorption peak is produced by one or two period stacks.

Figure 5:
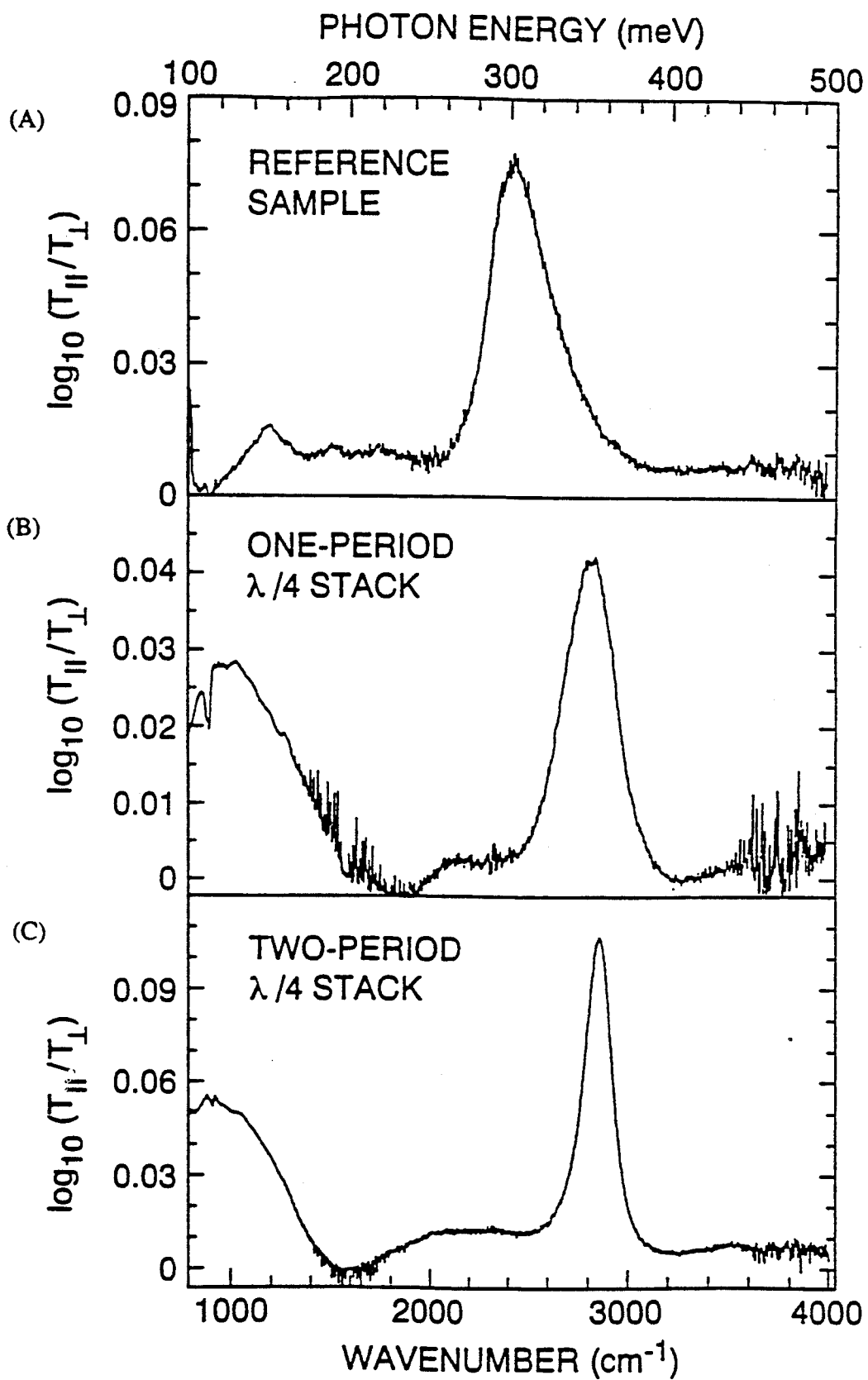
FIG. 5a-c are graphical illustrations showing the measured absorption for constructed devices.

Tests demonstrated that the quarter-wave stack structures behave as a good approximation of a state highly localized above the confinement well. The samples were processed into six-pass 45° edge waveguides, and the absorption spectra were measured with a Nicolet System 800 Fourier transform infrared spectrometer. FIGS. 5A, 5B, and 5C show the measured spectra for the reference, the 1 period and the 2 period devices, respectively. As can be seen, the absorption peak corresponding to transitions to states above the well is much narrower in the 2 period quarter-wave reflector structure than in the reference sample. The position of the absorption peak shifts to higher energy in the samples with quarter-wave stacks, and the width of the absorption peak narrows by nearly a factor of two in going from the 1 period to the 2 period structure.

Figure 6:
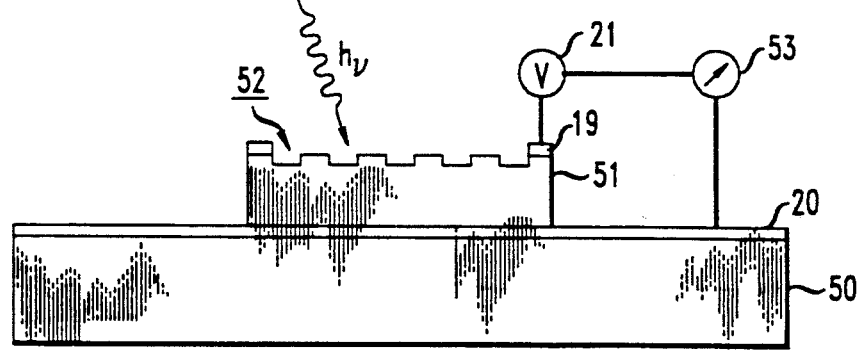
FIG. 6 is a schematic cross section of a photodetector using a FIG. 1 device.

FIG. 6 is a schematic cross section of a photodetector using a device of the type shown in FIG. 1. The structure comprises in essence, a semi-insulating substrate 50, a quantum well device 51 comprising a plurality of repetitions (preferably 20–50) of the confinement well $-(\lambda/4)$ stack structure, means for coupling light (hυ) into the device 51 such as a grating 52, and a current measuring instrument 53 serially connected with the voltage source of the device 51.

When used as a photodetector, the device is preferably constructed so that the confinement wells have a single bound state $E_1$ within the well and a localized state $E_4$ above the well, such that $E_4 - E_1 = h\upsilon$ for the light to be detected. By suitable choice of the materials and layer thicknesses the response wavelength can be tuned from the near infrared ($\sim 1$ μm) to the far infrared (10–70 μm). For example, a structure with GaInAs (30 Å) doped confinement wells and $$\text{AlInAs(38Å)/GaInAs(15Å)} \frac{\lambda}{4},$$

stacks has a narrow photoresponse centered at 3.54 micrometers. In operation a small bias of 1–30 kV/cm is applied to collect photocurrent, and the current measuring instrument 53 provides a measure of the incident light at 3.54 micrometers wavelength.

As a second example, a narrow band photodetector for 11 μm radiation can be made by a similar structure using a quantum well device with 38 Å GaAs confinement wells and quarter wave $Al_{0.22}Ga_{0.78}As$(80 Å)/GaAs (19 Å) stacks.

Figure 7:
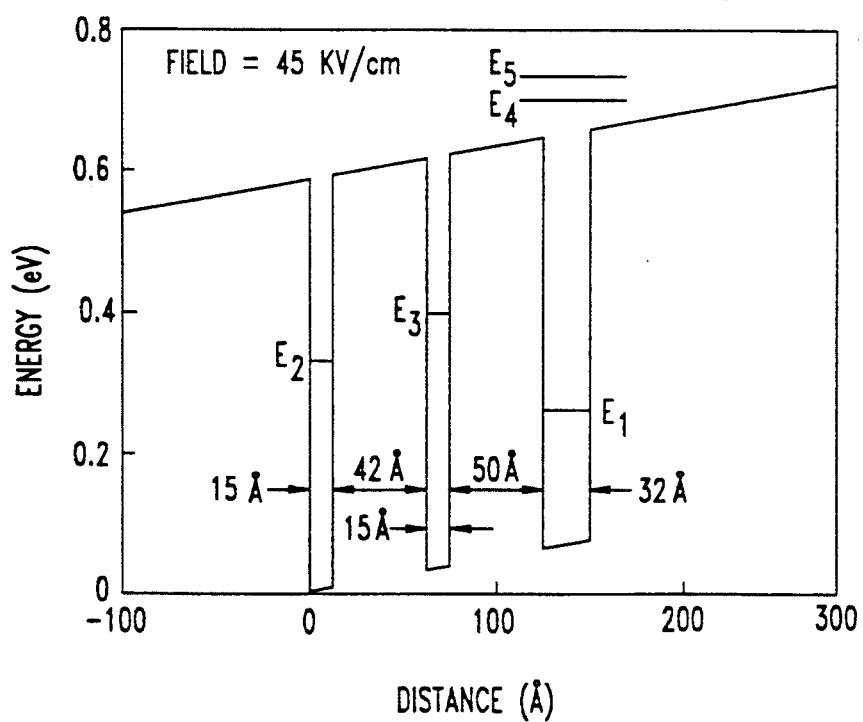
FIG. 7 is an energy level diagram of a modified device which can be used as either a photodetector or an optical modulator.

A third example, shown in FIG. 7, employs quarter wave stacks on but one side of the confinement well. Such a device can comprise a 32Å GaInAs $\frac{\lambda}{2}$ well n-doped to $10^{18}$ cm$^{-3}$ having a quarter wave AlInAs/GaInAs stack on only one side. The stack is dimensioned as shown in FIG. 7 to account for the variation in deBroglie wavelength produced by the voltage bias. At zero or small bias the absorption spectrum of the device is broad because the electron state is extended. But when a 45 kV/cm bias is applied, a localized state is formed, with electrons confined on one side by the quarter wave stack and on the other by the rising well barrier. With bias, the photon absorption is now narrow band and peaked at photon energy $\hbar\omega = E_4 - E_1$. The device can thus be used as a photodetector for 3.5 μm radiation. Alternatively, variation of the bias voltage as by a pulsed voltage supply (not shown) permits the device to be used as an optical modulator. If monochromatic light at the peak frequency is input to the device, variation of the bias voltage will vary the amount of light absorbed.

It is to be understood that the above-described embodiments are illustrative of only a few of the many possible specific embodiments which can represent applications of the principles of the invention. Thus, numerous and varied other arrangements can be made by those skilled in the art without departing from the spirit and scope of the invention.

We claim:

1. A quantum well device for providing a localized state for electrons of energy E measured from the bottom of the well greater than the barrier height $\Delta E_c$ of the adjacent barrier layers comprising:

a confinement quantum well layer disposed between a pair of barrier layers, said well layer having a thickness $L_w$ equal to an integral number n of half deBroglie wavelengths of an electron of energy E;

adjacent said well layer on at least one side thereof a quarter wave stack of barrier layers and well layers;

said stack barrier layers having a thickness $L_b$ equal to an odd number of quarter deBroglie wavelengths of an electron of energy E; and said stack well layers having a thickness $L_s$ equal to an odd number of quarter deBroglie wavelength of an electron of energy E.

2. A device according to claim 1 comprising quarter wave stacks on both sides of said confinement quantum well.

3. A device according to claim 1 wherein said confinement quantum well includes at least one bound electron state at an energy $E_1$ within the well.

4. A device according to claim 3 further comprising means for directing into said device photons of radiation having energy equal to $E - E_1$.

5. A device according to claim 1 including means for applying voltage across said device.

6. A photodetector comprising a device according to claim 4 for absorbing photons of radiation having energy equal to $E - E_1$ and means for measuring the current generated by such absorption.

7. An optical modulator comprising a device according to claim 4 for absorbing photons of radiation having energy equal to $E - E_1$ and means for varying the amount of light absorbed by said device.

8. The modulator of claim 7 wherein said device according to claim 4 comprises a device having a quarter wave stack on only one side of said confinement well and said means for varying the light absorbed by said device comprises means for varying a bias voltage applied to said device.

* * * * *